(12) United States Patent
Miyake et al.

(10) Patent No.: US 10,840,386 B2
(45) Date of Patent: Nov. 17, 2020

(54) SEMICONDUCTOR APPARATUS

(71) Applicants: TOYOTA JIDOSHA KABUSHIKI KAISHA, Toyota (JP); DENSO CORPORATION, Kariya (JP)

(72) Inventors: Hiroki Miyake, Toyota (JP); Yasushi Urakami, Kariya (JP); Yusuke Yamashita, Nagakute (JP)

(73) Assignees: TOYOTA JIDOSHA KABUSHIKI KAISHA, Toyota (JP); DENSO CORPORATION, Kariya (JP)

(*) Notice: Subject to any disclaimer, the term of this patent is extended or adjusted under 35 U.S.C. 154(b) by 0 days.

(21) Appl. No.: 16/468,059

(22) PCT Filed: Nov. 28, 2017

(86) PCT No.: PCT/IB2017/001467
§ 371 (c)(1),
(2) Date: Jun. 10, 2019

(87) PCT Pub. No.: WO2018/115950
PCT Pub. Date: Jun. 28, 2018

(65) Prior Publication Data
US 2020/0020814 A1    Jan. 16, 2020

(30) Foreign Application Priority Data
Dec. 19, 2016  (JP) .................. 2016-245760

(51) Int. Cl.
*H01L 29/872* (2006.01)
*H01L 29/06* (2006.01)
(Continued)

(52) U.S. Cl.
CPC ...... *H01L 29/8725* (2013.01); *H01L 29/0611* (2013.01); *H01L 29/0692* (2013.01); *H01L 29/4236* (2013.01); *H01L 29/66143* (2013.01)

(58) Field of Classification Search
CPC .............. H01L 29/872; H01L 29/8725; H01L 29/6606; H01L 29/66143; H01L 29/0692; H01L 29/7806
See application file for complete search history.

(56) References Cited

U.S. PATENT DOCUMENTS

| | | |
|---|---|---|
| 2007/0034901 A1 | 2/2007 | Lui et al. |
| 2012/0056262 A1 | 3/2012 | Saito et al. |
| 2014/0167201 A1 | 6/2014 | Arai et al. |

FOREIGN PATENT DOCUMENTS

| | | |
|---|---|---|
| JP | 2009-105200 A | 5/2009 |
| JP | 2013-115394 A | 6/2013 |

*Primary Examiner* — Robert G Bachner
*Assistant Examiner* — Molly K Reida
(74) *Attorney, Agent, or Firm* — Oliff PLC

(57) ABSTRACT

A semiconductor apparatus has a semiconductor substrate, a first trench provided in a front surface of the semiconductor substrate, an anode electrode provided inside the first trench, and a cathode electrode provided on a back surface of the semiconductor substrate. The semiconductor substrate has a first p-type region, a second p-type region, and a main n-type region which is in contact with the first p-type region and the second p-type region, and is in Schottky contact with the anode electrode in the side surface of the first trench. The semiconductor substrate satisfies the relationship that an area of the first trench, when the front surface is viewed in a plan view, is smaller than an area of a Schottky interface where the main n-type region is in contact with the anode electrode in the side surface of the first trench.

7 Claims, 9 Drawing Sheets

(51) Int. Cl.
*H01L 29/423* (2006.01)
*H01L 29/66* (2006.01)

SEMICONDUCTOR APPARATUS

BACKGROUND OF THE INVENTION

1. Field of the Invention

A technique disclosed in the specification relates to a semiconductor apparatus.

2. Description of Related Art

Japanese Unexamined Patent Application Publication No. 2013-115394 (JP 2013-115394 A) discloses a Schottky barrier diode (hereinafter, referred to as SBD). The SBD has a semiconductor substrate with a trench provided in a front surface thereof. An anode electrode is provided inside the trench. A cathode electrode is provided on a back surface of the semiconductor substrate. The semiconductor substrate has a p-type region that is in contact with the anode electrode in a bottom surface of the trench, and an n-type region that is in Schottky contact with the anode electrode in a side surface (that is, above the p-type region) of the trench. The n-type region is also in contact with the cathode electrode. A Schottky interface of the anode electrode and the n-type region functions as the SBD. The anode electrode is provided inside the trench, whereby it is possible to further widen the Schottky interface of the anode electrode and the n-type region. For this reason, the SBD has comparatively low on-resistance. In a case where a reverse voltage (a voltage that becomes higher on the cathode electrode than on the anode electrode) is applied to the SBD, a depletion layer extends from the p-type region to the n-type region around the p-type region. Then, a voltage applied to the Schottky interface above the p-type region is sufficiently reduced. With this, a leakage current flowing in the SBD at the time of application of the reverse voltage is more effectively suppressed.

SUMMARY OF THE INVENTION

Even in the SBD of JP 2013-115394 A, at the time of application of the reverse voltage, a voltage applied to the Schottky interface above the p-type region may not be sufficiently reduced, and a leakage current may occur. Accordingly, the specification provides a technique capable of more effectively suppressing a leakage current in a semiconductor apparatus including an SBD.

An aspect of the present disclosure relates to a semiconductor apparatus including a semiconductor substrate, a first trench, an anode electrode, and a cathode electrode. The first trench is provided in a front surface of the semiconductor substrate. The anode electrode is provided inside the first trench. The cathode electrode is provided on a back surface of the semiconductor substrate. The semiconductor substrate has a first p-type region, a second p-type region, and a main n-type region. The first p-type region is in contact with the anode electrode in a bottom surface of the first trench. The second p-type region is in contact with the anode electrode in a side surface of the first trench. The main n-type region is in contact with the first p-type region and the second p-type region, is in Schottky contact with the anode electrode in the side surface of the first trench, separates the first p-type region from the second p-type region, and is in contact with the cathode electrode. The semiconductor substrate is configured to satisfy a relationship that an area of the first trench, when the front surface is viewed in a plan view, is smaller than an area of a Schottky interface where the main n-type region is in contact with the anode electrode in the side surface of the first trench.

According to the aspect of the present disclosure, the semiconductor substrate has the second p-type region that is in contact with the anode electrode in the side surface of the first trench, in addition to the first p-type region that is in contact with the anode electrode in the bottom surface of the first trench. The second p-type region is a p-type region that is separated from the first p-type region. For this reason, in a case where a reverse voltage is applied between the anode electrode and the cathode electrode, a depletion layer extends from the first p-type region to the main n-type region near the bottom surface of the first trench, and a depletion layer extends from the second p-type region above the first p-type region to the main n-type region. Since the depletion layer extending from the second p-type region depletes near the side surface of the first trench, it is possible to more effectively reduce a voltage applied to the Schottky interface where the main n-type region and the anode electrode are in contact with each other in the side surface of the first trench. Therefore, according to the aspect of the present disclosure, it is possible to more effectively suppress a leakage current that occurs in an SBD.

In a case where the second p-type region that is in contact with the anode electrode in the side surface of the first trench is provided, the Schottky interface where the main n-type region and the anode electrode are in contact with each other in the side surface of the first trench is narrowed. However, in the above-described semiconductor apparatus, the relationship that the area of the first trench when the front surface of the semiconductor substrate is viewed in a plan view, is smaller than the area of the Schottky interface where the main n-type region is in contact with the anode electrode in the side surface of the first trench is satisfied. In a case where the above-described relationship is satisfied, it is possible to further widen the area of the Schottky interface of the anode electrode and the main n-type region compared to a case where the anode electrode is provided on the front surface of the semiconductor substrate without providing the first trench. That is, it is possible to obtain an advantage of sufficiently reducing on-resistance of a trench structure.

As described above, according to the above-described semiconductor apparatus, it is possible to more effectively suppress a leakage current at the time of application of a reverse voltage while obtaining an advantage of a trench structure.

BRIEF DESCRIPTION OF THE DRAWINGS

Features, advantages, and technical and industrial significance of exemplary embodiments of the invention will be described below with reference to the accompanying drawings, in which like numerals denote like elements, and wherein.

DETAILED DESCRIPTION OF EMBODIMENTS

Figure 1:
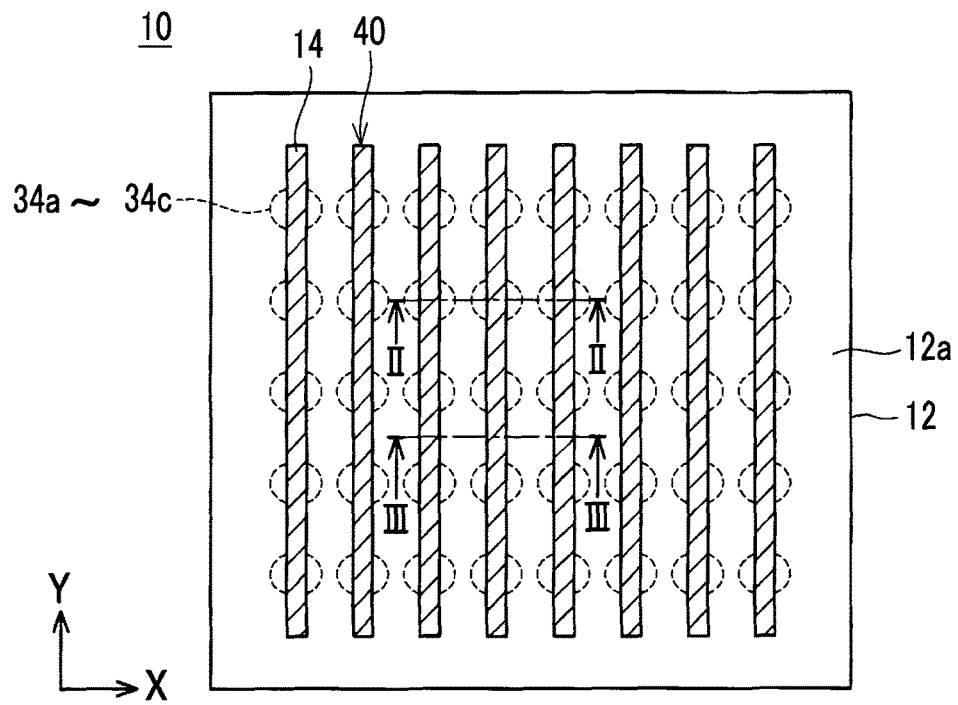
FIG. 1 is a plan view of a semiconductor apparatus of Example 1.

A semiconductor apparatus 10 shown in FIG. 1 has a semiconductor substrate 12. In FIG. 1, electrodes and the like on the semiconductor substrate 12 are not shown. The semiconductor substrate 12 is a substrate primarily made of SiC. As shown in FIG. 1, in an upper surface 12a of the semiconductor substrate 12, a plurality of anode trenches 40 is provided. Hereinafter, one direction parallel to the upper surface 12a of the semiconductor substrate 12 is referred to as an X direction, and a direction perpendicular to the X direction on the upper surface 12a is referred to as a Y direction. As shown in FIG. 1, the anode trenches 40 extend in parallel with each other in the Y direction. As shown in FIG. 1, the anode trenches 40 are arranged at regular intervals in the X direction.

Figure 2:
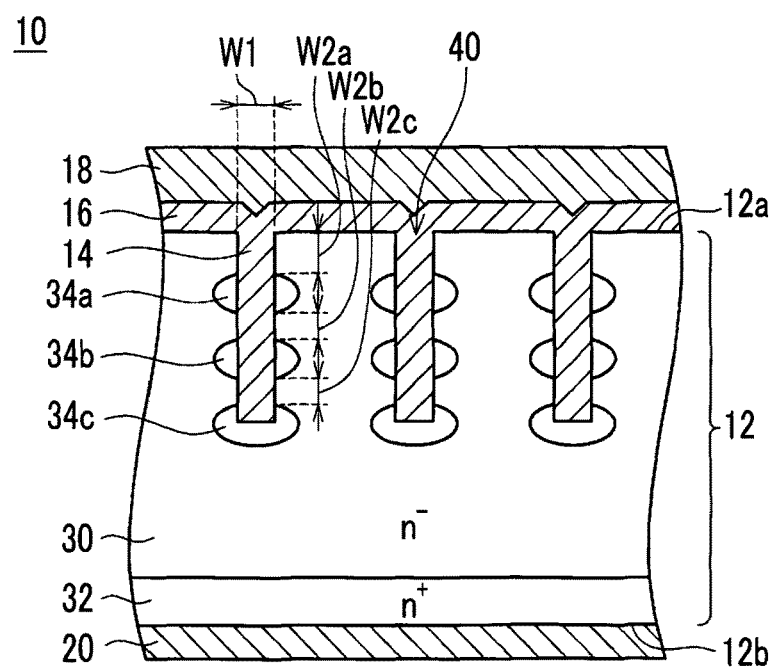
FIG. 2 is a sectional view taken along line II-II of FIG. 1.

As shown in FIG. 2, an anode electrode 14 is disposed inside each anode trench 40. The anode electrode 14 is in contact with the semiconductor substrate 12 over the inner surface of the anode trench 40. The upper surface 12a of the semiconductor substrate 12 is covered with a front electrode 16. The front electrode 16 is in contact with the semiconductor substrate 12 substantially over the entire region of the upper surface 12a. The anode electrode 14 and the front electrode 16 are connected to each other. The front surface of the front electrode 16 is covered with a metal layer 18. A lower surface 12b of the semiconductor substrate 12 is covered with a cathode electrode 20. The cathode electrode 20 is in contact with the semiconductor substrate 12 substantially over the entire region of the lower surface 12b.

The semiconductor substrate 12 has a drift region 30 and a cathode region 32. The cathode region 32 is an n-type region that has an n-type impurity concentration higher than that of the drift region 30. The cathode region 32 is in ohmic contact with the cathode electrode 20 substantially over the entire region of the lower surface 12b of the semiconductor substrate 12. The drift region 30 is disposed on the cathode region 32. The drift region 30 is an n-type region that has an n-type impurity concentration lower than that of the cathode region 32. The drift region 30 is in Schottky contact with the anode electrode 14 in a part of a side surface of each anode trench 40. The drift region 30 is in Schottky contact with the front electrode 16 on the upper surface 12a of the semiconductor substrate 12.

Figure 3:
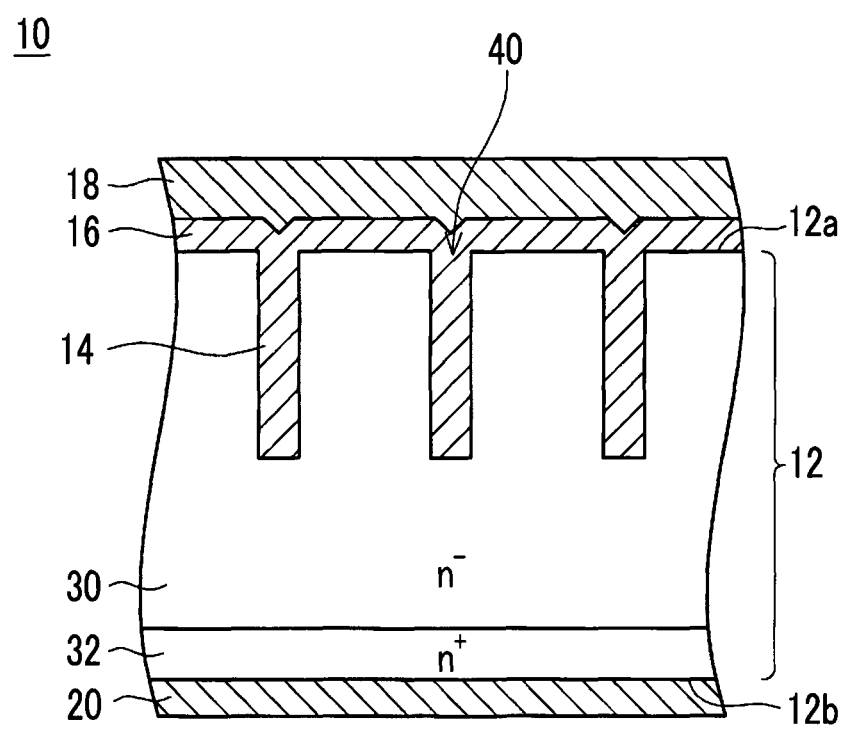
FIG. 3 is a sectional view taken along line of FIG. 1.

As shown in FIGS. 1 and 2, the semiconductor substrate 12 has p-type regions 34a, 34b, 34c within a range of being in contact with each anode electrode 14. As shown in FIG. 1, the p-type regions 34a, 34b, 34c are provided so as to overlap one another in a plan view from the upper surface 12a side. Each anode electrode 14 is provided with a plurality of sets of p-type regions 34a, 34b, 34c. The sets of the p-type regions 34a, 34b, 34c in each anode electrode 14 are disposed at intervals in the Y direction. As shown in FIG. 2, an interval is provided between the p-type regions 34a, between the p-type regions 34b, and between the p-type regions 34c of adjacent anode electrodes 14. The drift region 30 is present in the above-described interval. As shown in FIG. 3, at a position where the set of the p-type regions 34a, 34b, 34c is not provided, the drift region 30 is in Schottky contact with the anode electrode 14 over the entire region of the side surface and the bottom surface of the anode trench 40.

As shown in FIG. 2, each p-type region 34c is in contact with the anode electrode 14 in the bottom surface and the side surface near the bottom surface of the anode trench 40. Each p-type region 34b is disposed above the corresponding p-type region 34c. Each p-type region 34b is in contact with the anode electrode 14 in the side surface of the anode trench 40. Each p-type region 34a is disposed above the corresponding p-type region 34b. Each p-type region 34a is in contact with the anode electrode 14 in the side surface of the anode trench 40.

An interval is provided between the p-type region 34c and the p-type region 34b above the p-type region 34c, and the drift region 30 is in Schottky contact with the anode electrode 14 in the interval. The interval (that is, a Schottky interface where the drift region 30 and the anode electrode 14 are in Schottky contact with each other) between the p-type region 34c and the p-type region 34b above the p-type region 34c has a width W2c.

An interval is provided between the p-type region 34b and the p-type region 34a above the p-type region 34b, and the drift region 30 is in Schottky contact with the anode electrode 14 in the interval. The interval (that is, a Schottky interface where the drift region 30 and the anode electrode 14 are in Schottky contact with each other) between the p-type region 34b and the p-type region 34a above the p-type region 34b has a width W2b.

An interval is provided between the p-type region 34a and the upper surface 12a of the semiconductor substrate 12, and the drift region 30 is in Schottky contact with the anode electrode 14 in the interval. The interval (that is, a Schottky interface where the drift region 30 and the anode electrode 14 are in Schottky contact with each other) between the p-type region 34a and the upper surface 12a has a width W2a.

A total value W2 (=W2a+W2b+W2c) of the widths W2a, W2b, W2c is greater than a width W1 (that is, the dimension of the anode trench 40 in the X direction) of the anode trench 40 in the upper surface 12a. That is, the relationship of W1<W2 is satisfied. The total value W2 is a total value of the widths (the widths measured along a depth direction) of the Schottky interfaces where the drift region 30 is in Schottky contact with the anode electrode 14 in a cross-section including the p-type regions 34a, 34b, 34c. As shown in FIGS. 1 and 3, in a part of the anode trench 40, the p-type regions 34a, 34b, 34c are not provided. Accordingly, an area S2 of the Schottky interface where the drift region 30 is in contact with the anode electrode 14 in the side surface of one anode trench 40 is greater than an area (that is, the area occupied by an opening of the anode trench 40 in the upper surface 12a) S1 of the anode trench 40 when the upper surface 12a is viewed in a plan view. That is, a relationship of S1<S2 is satisfied.

Inside the semiconductor substrate 12, an SBD is formed by the interface where the drift region 30 is in Schottky contact with the anode electrode 14 and the front electrode 16.

In a case where the potential of the anode electrode 14 and the front electrode 16 is made to be higher than the potential of the cathode electrode 20, a forward voltage is applied to the SBD, and the SBD is turned on. That is, electrons flow from the cathode electrode 20 to the drift region 30 through the cathode region 32. The electrons flowing into the drift region 30 flow to the anode electrode 14 and the front electrode 16 through the Schottky interface. That is, a current flows from the anode electrode 14 and the front electrode 16 to the cathode electrode 20.

As described above, in the semiconductor apparatus 10, the relationship of S1<S2 is satisfied. That is, the area S1 of the opening of the anode trench 40 in the upper surface 12a is greater than the area S2 of the Schottky interface inside the anode trench 40. For this reason, it is possible to enlarge the area of the Schottky interface compared to a case where the Schottky interface is provided in the upper surface 12a without providing the anode trench 40. That is, it is possible to obtain an effect of enlarging the area of the Schottky interface by providing the anode trench 40. Accordingly, in the semiconductor apparatus 10, the on-resistance of the SBD is comparatively small.

In a case where the potential of the cathode electrode 20 is made to be higher than the potential of the anode electrode 14 and the front electrode 16, a reverse voltage is applied to the SBD, and the SBD is turned off. That is, the current flowing in the SBD is stopped. At this time, a reverse voltage is also applied to pn junctions of interfaces of the p-type regions 34a, 34b, 34c and the drift region 30. For this reason, depletion layers spread from the p-type regions 34a, 34b, 34c to the drift region 30. With the depletion layer spreading from the p-type region 34c, an electric field applied to the Schottky interface near the p-type region 34c (that is, near the bottom surface of the anode trench 40) is efficiently relaxed. In particular, with the depletion layers that spread from the two adjacent p-type regions 34c, the drift region 30 between the two p-type regions 34c is pinched off. Accordingly, the electric field applied to the Schottky interface near the bottom surface of the anode trench 40 is efficiently relaxed. With the depletion layer that spreads from the p-type region 34b, an electric field applied to the Schottky interface near the p-type region 34b (that is, near an intermediate portion in the depth direction of the anode trench 40) is efficiently relaxed. In particular, with the depletion layers that spread from the two adjacent p-type regions 34b, the drift region 30 between the two p-type regions 34b is pinched off. Accordingly, the electric field applied to the Schottky interface near the intermediate portion in the depth direction of the anode trench 40 is efficiently relaxed. With the depletion layer that spreads from the p-type region 34a, an electric field applied to the Schottky interface near the p-type region 34a (that is, near an upper end portion of the anode trench 40) is efficiently relaxed. In particular, with the depletion layers that spread from the two adjacent p-type regions 34a, the drift region 30 between the two p-type regions 34a is pinched off. Accordingly, the electric field applied to the Schottky interface near the upper end portion of the anode trench 40 is efficiently relaxed.

As described above, in the semiconductor apparatus 10 of Example 1, the three p-type regions 34a to 34c are provided in a distributed manner in the depth direction for each anode trench 40 (that is, each anode electrode 14). For this reason, it is possible to efficiently relax the electric field applied to the Schottky interface over the entire region in the depth direction of the anode trench 40. Therefore, according to the structure of the semiconductor apparatus 10, a leakage current more hardly flows in the SBD when a reverse voltage is applied.

In a case where a forward voltage is applied, holes may or may not flow from the p-type regions 34a, 34b, 34c into the drift region 30. In a case where holes flow from the p-type regions 34a, 34b, 34c into the drift region 30, the on-resistance of the diode is sufficiently reduced. In a case where holes do not flow from the p-type regions 34a, 34b, 34c into the drift region 30, recovery loss of the diode is sufficiently reduced.

Figure 4:
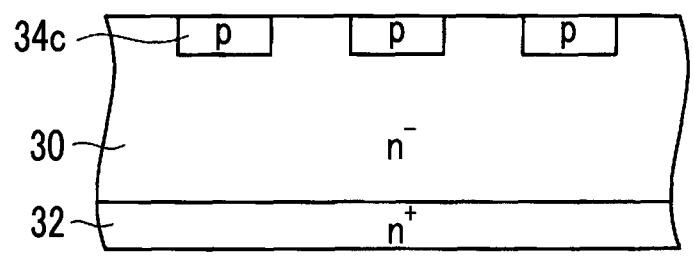
FIG. 4 is an explanatory view of a method of manufacturing a semiconductor apparatus.
Figure 5:
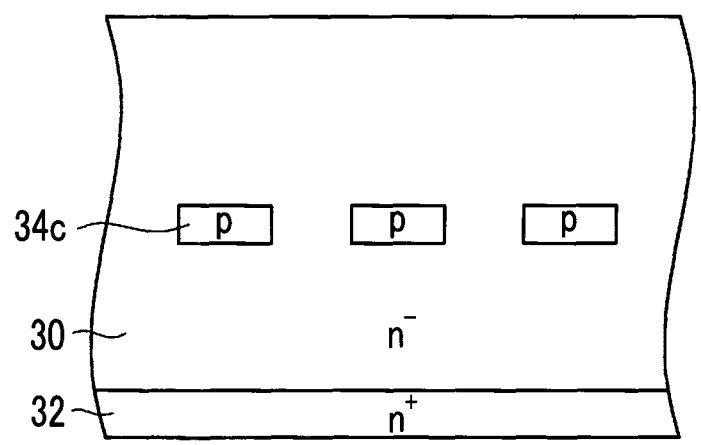
FIG. 5 is an explanatory view of the method of manufacturing a semiconductor apparatus.
Figure 6:
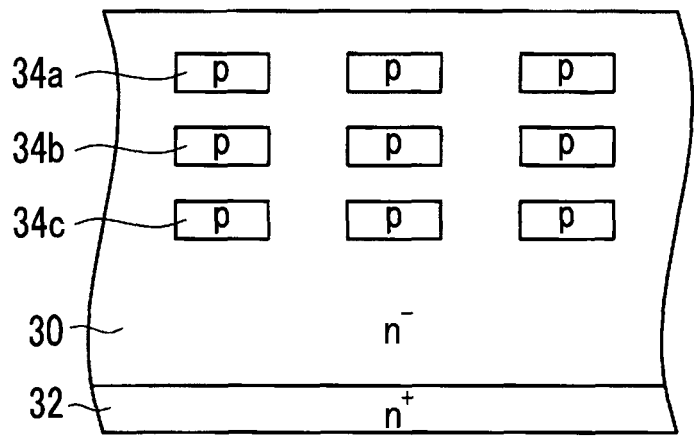
FIG. 6 is an explanatory view of the method of manufacturing a semiconductor apparatus.
Figure 7:
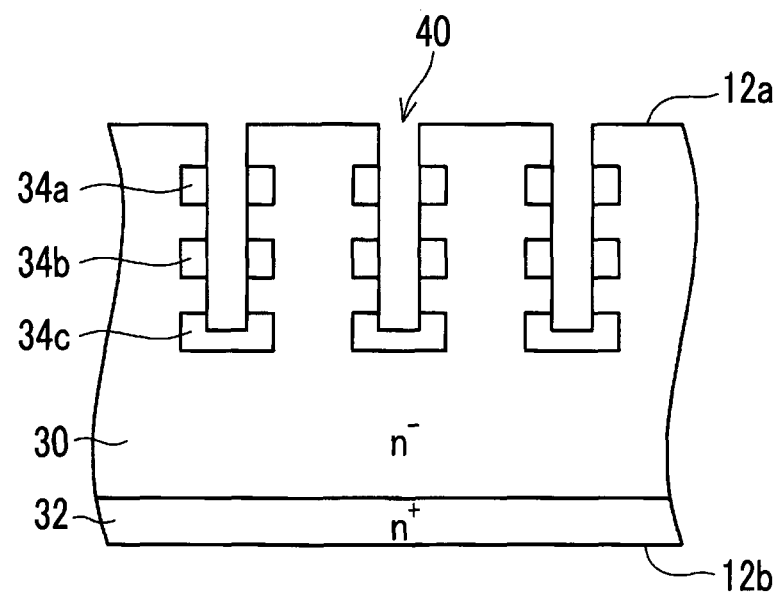
FIG. 7 is an explanatory view of the method of manufacturing a semiconductor apparatus.

FIGS. 4 to 7 show a manufacturing process of the semiconductor apparatus 10. The semiconductor apparatus 10 is manufactured from a semiconductor substrate including a cathode region 32 and a drift region 30 above the cathode region 32. First, as shown in FIG. 4, a plurality of p-type regions 34c is formed within a range of being exposed to a front surface of the semiconductor substrate by ion implantation. Next, as shown in FIG. 5, the drift region 30 is epitaxially grown in the front surface of the semiconductor substrate. Next, a p-type impurity is implanted multiple times while changing an implantation depth. Thus, as shown in FIG. 6, the p-type region 34b and the p-type region 34a are formed inside the drift region 30 (above the p-type region 34c). Next, as shown in FIG. 7, a plurality of anode trenches 40 that passes through the p-type regions 34a, 34b and reaches the p-type region 34c is formed in the upper surface 12a of the semiconductor substrate 12. Thereafter, the anode electrode 14, the front electrode 16, the metal layer 18, and the cathode electrode 20 are formed. Thus, the semiconductor apparatus 10 shown in FIGS. 1 to 3 is completed.

Figure 8:
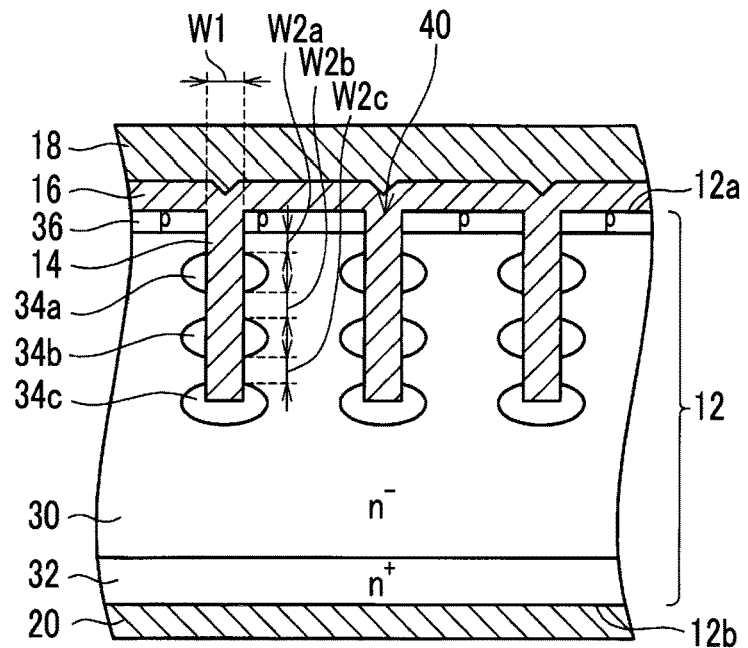
FIG. 8 is a plan view of a semiconductor apparatus of Example 2.

As shown in FIG. 8, in a semiconductor apparatus of Example 2, a p-type region 36 is provided within a range of being exposed to the upper surface 12a of the semiconductor substrate 12. The p-type region 36 is provided within the entire range in which the front electrode 16 and the semiconductor substrate 12 are in contact with each other. Since a variety of stress is applied to the upper surface 12a of the semiconductor substrate 12 during a manufacturing process, it is difficult to stabilize the state of the upper surface 12a. Accordingly, as in Example 1 (FIGS. 2 and 3), in a case where the drift region 30 and the front electrode 16 are brought into Schottky contact with each other in the upper surface 12a, a barrier height of a Schottky interface between the drift region 30 and the front electrode 16 is not stable. For this reason, at the time of mass production of a semiconductor apparatus, variation occurs in the characteristics of the SBD among the semiconductor apparatuses. In contrast, as in FIG. 8, in a case where the p-type region 36 is provided, a Schottky interface is not formed in the upper surface 12a. Accordingly, at the time of mass production, it is possible to more effectively suppress the occurrence of variation in the characteristics of the SBD among the semiconductor apparatuses. Stress is hardly applied to the side surface of the anode trench 40 compared to the upper surface 12a during the manufacturing process. The anode electrode 14 is formed immediately after the anode trench 40 is formed. Accordingly, it is possible to comparatively stabilize the state of the side surface of the anode trench 40, and it is comparatively easy to stabilize the barrier height of the Schottky interface in the side surface of the anode trench 40.

Figure 9:
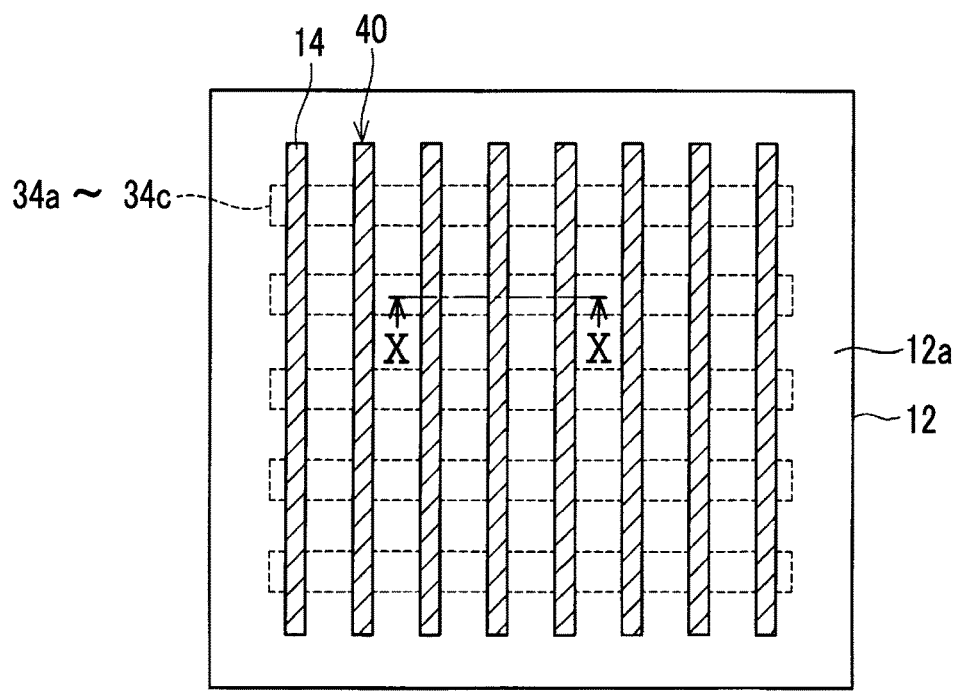
FIG. 9 is a plan view of a semiconductor apparatus of Example 3.
Figure 10:
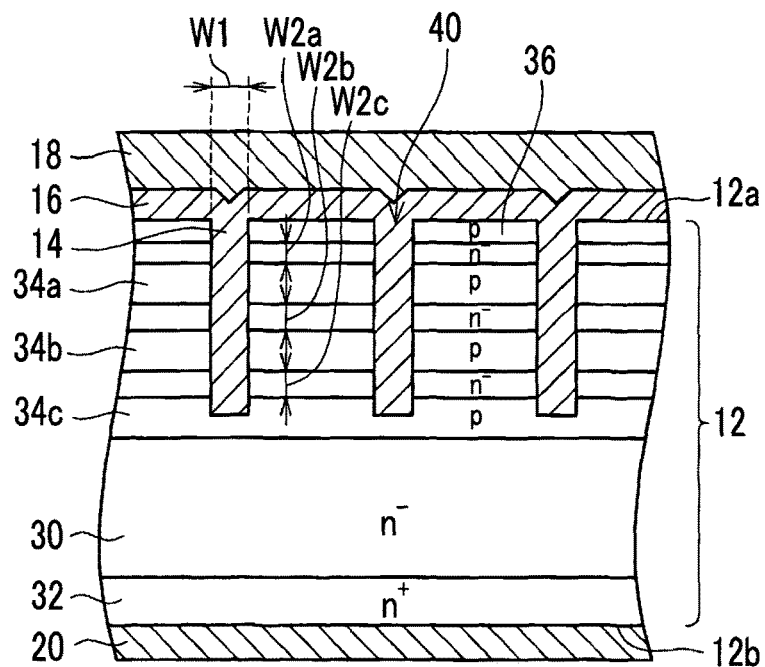
FIG. 10 is a sectional view taken along line X-X of FIG. 9.

As shown in FIGS. 9 and 10, in a semiconductor apparatus of Example 3, the p-type regions 34*a*, 34*b*, 34*c* extend in a stripe shape in a horizontal direction (a direction crossing the anode trench 40). The p-type region 36 is provided within a range of being exposed to the upper surface 12*a* of the semiconductor substrate 12. In a portion (a portion corresponding to the cross-section of FIG. 3) where the p-type regions 34*a*, 34*b*, 34*c* are not provided, the drift region 30 is in Schottky contact with the anode electrode 14 over the entire region of the side surface and bottom surface of the anode trench 40 below the p-type region 36. The drift region 30 is in Schottky contact with the anode electrode 14 in the interval (the interval having the width W2*c*) between the p-type region 34*c* and the p-type region 34*b*, the interval (the interval having the width W2*b*) between the p-type region 34*b* and the p-type region 34*a*, and the interval (the interval having the width W2*a*) between the p-type region 34*a* and the p-type region 36. Other configurations of the semiconductor apparatus of Example 3 are the same as those of the semiconductor apparatus of Example 1.

In the above-described semiconductor apparatus, the total value W2 of the widths W2*a*, W2*b*, W2*c* is greater than the width W1 of the anode trench 40. Accordingly, the area S2 of the Schottky interface where the drift region 30 is in contact with the anode electrode 14 in the side surface of one anode trench 40 is greater than the area S1 of one anode trench 40 when the upper surface 12*a* is viewed in a plan view.

In the semiconductor apparatus of Example 3, in a case where a forward voltage is applied to the SBD, electrons flow through a portion where the p-type regions 34*a*, 34*b*, 34*c* are not present (a portion corresponding to the cross-section of FIG. 3). Even in the semiconductor apparatus of Example 3, since the relationship of S1<S2 is satisfied, the on-resistance of the SBD is comparatively small. In the semiconductor apparatus of Example 3, in a case where a reverse voltage is applied to the SBD, the depletion layers spread from the p-type regions 34*a*, 34*b*, 34*c* to the drift region 30. The drift region 30 (that is, the portion corresponding to the cross-section of FIG. 3) of the portion where electrons flow is depleted with the depletion layers, whereby the SBD is turned off. Even in the semiconductor apparatus of Example 3, since the three p-type regions 34*a* to 34*c* are provided in a distributed manner in the depth direction for each anode trench 40, it is possible to efficiently relax an electric field applied to the Schottky interface over the entire region in the depth direction of the anode trench 40. Therefore, even in the semiconductor apparatus of Example 3, a leakage current more hardly flows in the SBD.

Figure 11:
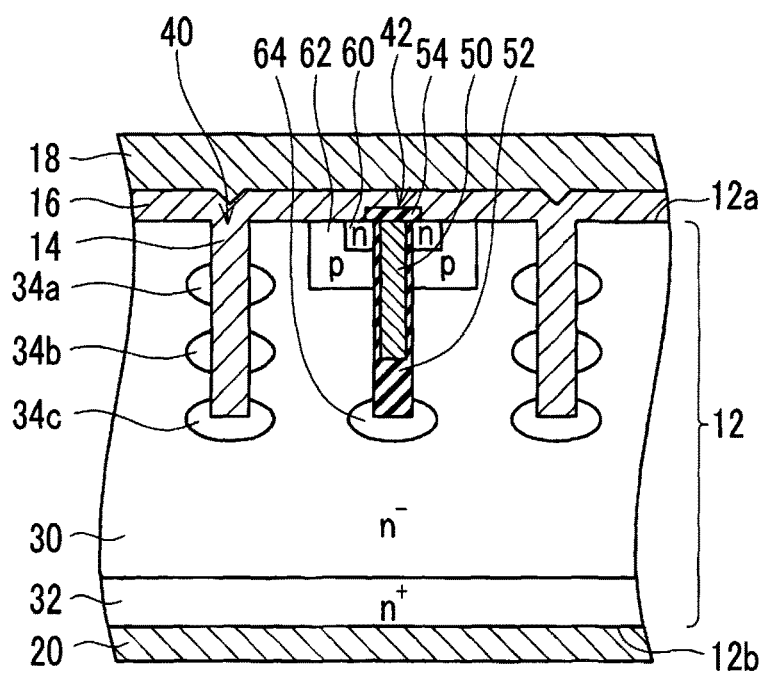
FIG. 11 is a sectional view of a semiconductor apparatus of Example 4.

As shown in FIG. 11, in a semiconductor apparatus of Example 4, a gate trench 42 is provided between two anode trenches 40. The gate trench 42 is provided in the upper surface 12*a* of the semiconductor substrate 12. Though not shown, the gate trench 42 extends in parallel with the anode trench 40 in the upper surface 12*a*. An inner surface of the gate trench 42 is covered with a gate insulating layer 52. A gate electrode 50 is disposed inside the gate trench 42. The gate electrode 50 is insulated from the semiconductor substrate 12 by the gate insulating layer 52. An upper surface of the gate electrode 50 is covered with an insulating interlayer 54. The gate electrode 50 is insulated from the front electrode 16 by the insulating interlayer 54.

In the semiconductor apparatus of Example 4, the semiconductor substrate 12 has a source region 60, a body region 62, and a bottom region 64. The source region 60 is an n-type region. The source region 60 is in contact with the gate insulating layer 52 in an upper end portion of the gate trench 42. The source region 60 is in ohmic contact with the front electrode 16. The body region 62 is a p-type region. The body region 62 is provided within a range from below the source region 60 to a side of the source region 60. The body region 62 is in contact with the gate insulating layer 52 below the source region 60. The body region 62 is in ohmic contact with the front electrode 16 on the side of the source region 60. The body region 62 is in contact with the drift region 30. The source region 60 is separated from the drift region 30 by the body region 62. The drift region 30 is in contact with the gate insulating layer 52 below the body region 62. The bottom region 64 is a p-type region. The bottom region 64 is in contact with the gate insulating layer 52 in a bottom surface of the gate trench 42 and a side surface near the bottom surface of the gate trench 42. The bottom region 64 is in contact with the drift region 30.

In the semiconductor apparatus of Example 4, a MOSFET is constituted by the source region 60, the body region 62, the drift region 30, the cathode region 32, the gate insulating layer 52, the gate electrode 50, the front electrode 16, the cathode electrode 20. As in Example 1 described above, the semiconductor apparatus of Example 4 also has an SBD. The SBD operates in the same manner as in Example 1.

In a case where the MOSFET operates, the front electrode 16 functions as a source electrode, and the cathode electrode 20 functions as a drain electrode. In a state in which a potential of the cathode region 32 is higher than a potential of the front electrode 16, in a case where a potential (hereinafter, referred to as an on-potential) higher than a gate threshold is applied to the gate electrode 50, the MOSFET is turned on. That is, in a case where the on-potential is applied to the gate electrode 50, a channel is formed in the body region 62 near the gate insulating layer 52, and the source region 60 and the drift region 30 are connected to each other by the channel. For this reason, electrons flow from the front electrode 16 to the cathode electrode 20 through the source region 60, the channel, the drift region 30, and the cathode region 32. In a case where the potential of the gate electrode 50 decreases to a potential (hereinafter, referred to as an off-potential) lower than the gate threshold, the channel disappears, and the flow of the electrons is stopped. That is, the MOSFET is turned off. In a case where the MOSFET is turned off, a depletion layer extends from the body region 62 to the drift region 30. Furthermore, a depletion layer extends from the bottom region 64 to the drift region 30. In the above-described state, since a reverse voltage is applied to the SBD, depletion layers extend from the p-type regions 34*a*, 34*b*, 34*c* to the drift region 30. With the extension of the depletion layers as described above, application of a high electric field to the gate insulating layer 52 is more efficiently prevented. Therefore, the MOSFET has a high withstand voltage. Furthermore, with the extension of the depletion layers as described above, application of a high electric field to the Schottky interface of the SBD is more efficiently prevented. Therefore, a leakage current more hardly flows in the SBD.

Figure 12:
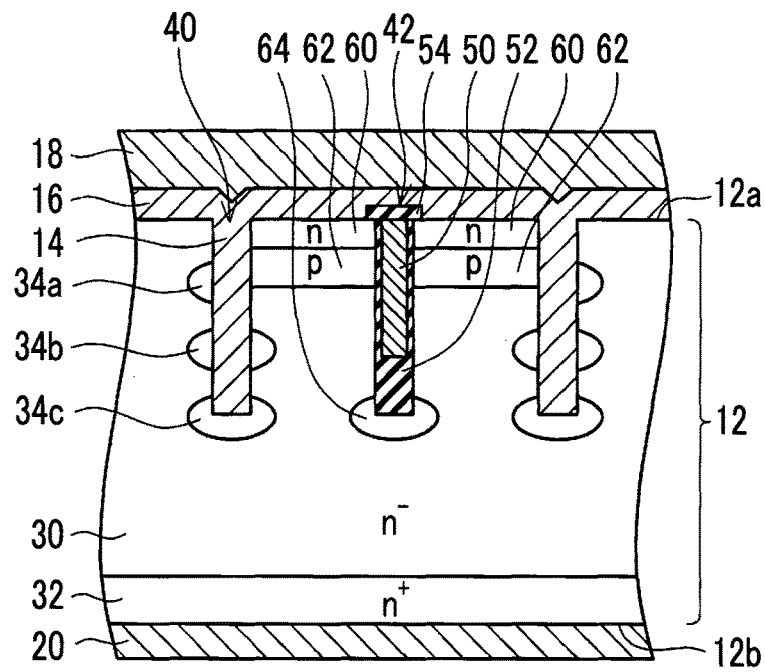
FIG. 12 is a sectional view of a semiconductor apparatus of Example 5.

As shown in FIG. 12, in a semiconductor apparatus of Example 5, a source region 60 is provided from the gate trench 42 to the anode trench 40. A body region 62 is provided over the entire region below the source region 60. The body region 62 is exposed to the upper surface 12*a* and in ohmic contact with the front electrode 16 at a position (not shown). In the semiconductor apparatus of Example 5, the source region 60 and the body region 62 are exposed to the upper surface 12a within a range between the gate trench 42 and the anode trench 40. For this reason, the drift region 30 is not exposed to the upper surface 12a within a range between the gate trench 42 and the anode trench 40, and thus, is not in contact with the front electrode 16. Other configurations of the semiconductor apparatus of Example 5 are substantially the same as those of the semiconductor apparatus of Example 4.

Even in the semiconductor apparatus of Example 5, the SBD and the MOSFET operate in the same manner as the semiconductor apparatus of Example 4 described above. In the semiconductor apparatus of Example 5, the drift region 30 is not in contact with the front electrode 16. For this reason, as the semiconductor apparatus of Example 2, it is possible to more effectively suppress the variation in barrier height. Therefore, at the time of mass production of a semiconductor apparatus, it is possible to more effectively suppress the variation in the characteristics of the SBD.

Figure 13:
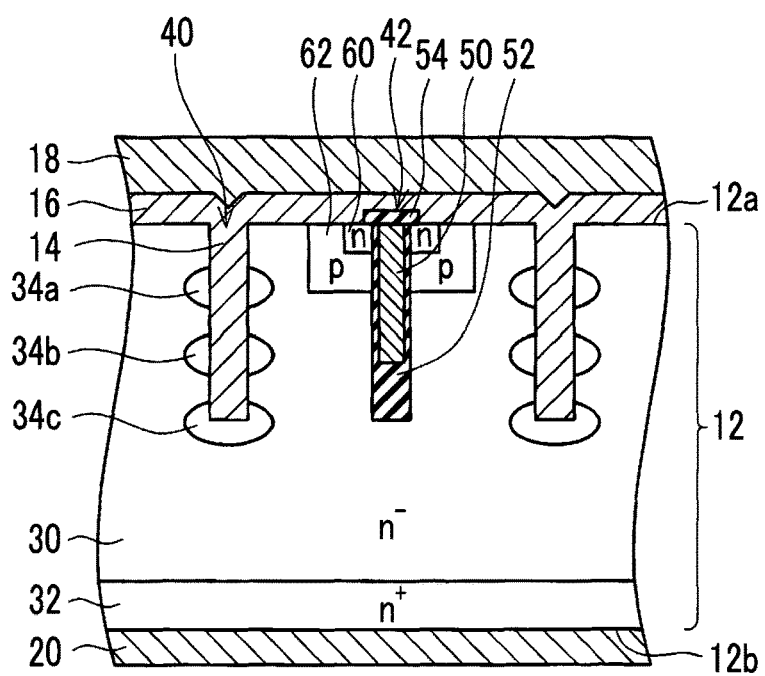
FIG. 13 is a sectional view of a semiconductor apparatus of Example 6.

As shown in FIG. 13, in a semiconductor apparatus of Example 6, the bottom region 64 is not provided in the bottom surface of the gate trench 42. The drift region 30 is in contact with the gate insulating layer 52 over the entire region of the bottom surface of the gate trench 42.

In the semiconductor apparatus of Example 6, when the MOSFET is turned off, the drift region 30 near the bottom surface of the gate trench 42 is depleted by a depletion layer extending from each p-type region 34c at the bottom of the anode trench 40. With this, application of a high electric field to the gate insulating layer 52 near the bottom surface of the gate trench 42 is more efficiently prevented. Therefore, even in the semiconductor apparatus of Example 6, it is possible to sufficiently realize a high withstand voltage of the MOSFET.

The semiconductor apparatus of Example 6 does not have the bottom region 64. Accordingly, when the MOSFET is turned on, electrons can pass through near the bottom surface of the gate trench 42. That is, in the semiconductor apparatus of Example 6, a path along which electrons flow directly below the channel (that is, the body region 62 near the gate insulating layer 52) is relatively wide. For this reason, according to the semiconductor apparatus of Example 6, it is possible to sufficiently reduce the on-resistance of the MOSFET.

Figure 14:
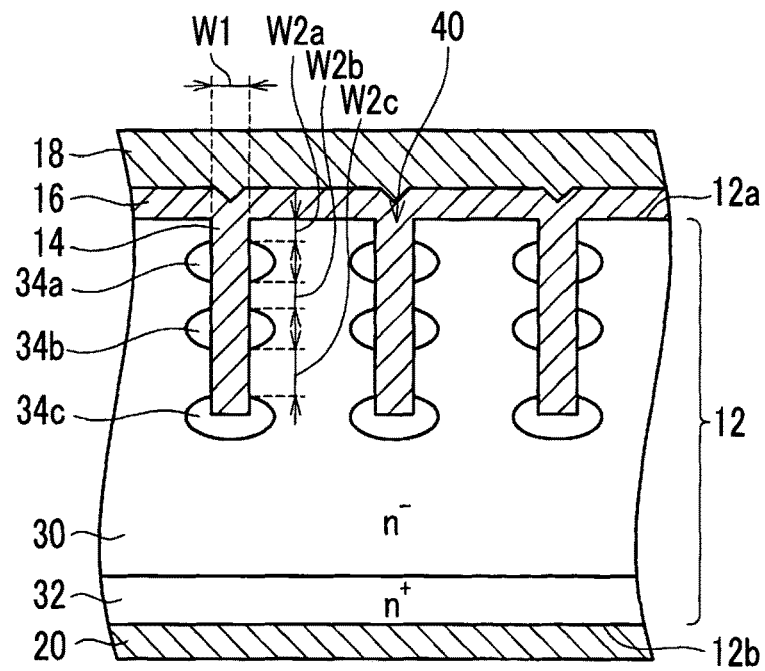
FIG. 14 is a sectional view of a semiconductor apparatus of a modification example.
Figure 15:
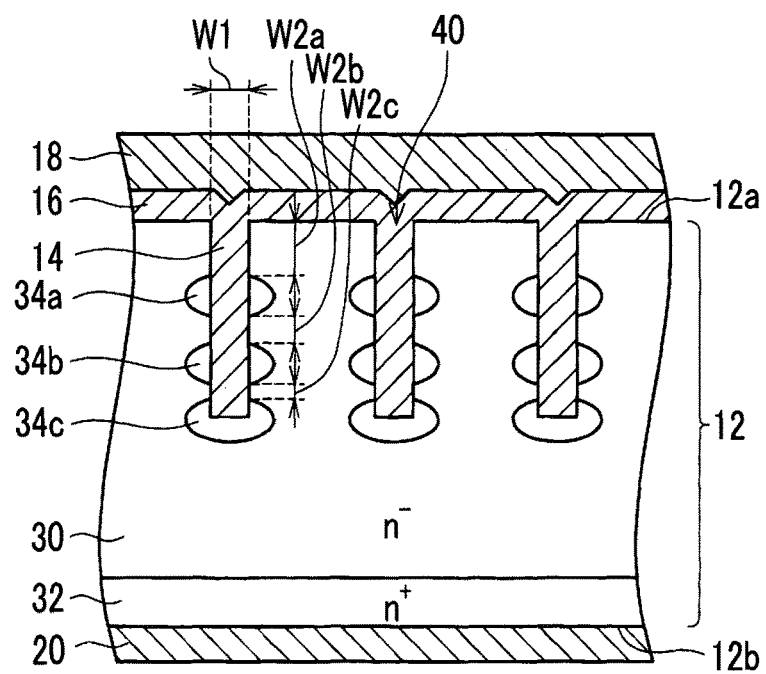
FIG. 15 is a sectional view of a semiconductor apparatus of a modification example.

In the semiconductor apparatuses of Examples 1 to 6 described above, the p-type regions 34a, 34b, 34c are disposed at substantially regular intervals in a thickness direction of the semiconductor substrate 12. That is, the widths W2a, W2b, W2c are substantially equal to one another. However, the intervals (that is, the widths W2a, W2b, W2c) of the p-type regions may be different from one another. For example, in Example 1, the interval between the p-type region 34b and the p-type region 34c may become relatively wide as shown in FIG. 14, or the interval between the p-type region 34b and the p-type region 34c may become relatively narrow as shown in FIG. 15. The same modification can be made to other Examples 2 to 6.

Figure 16:
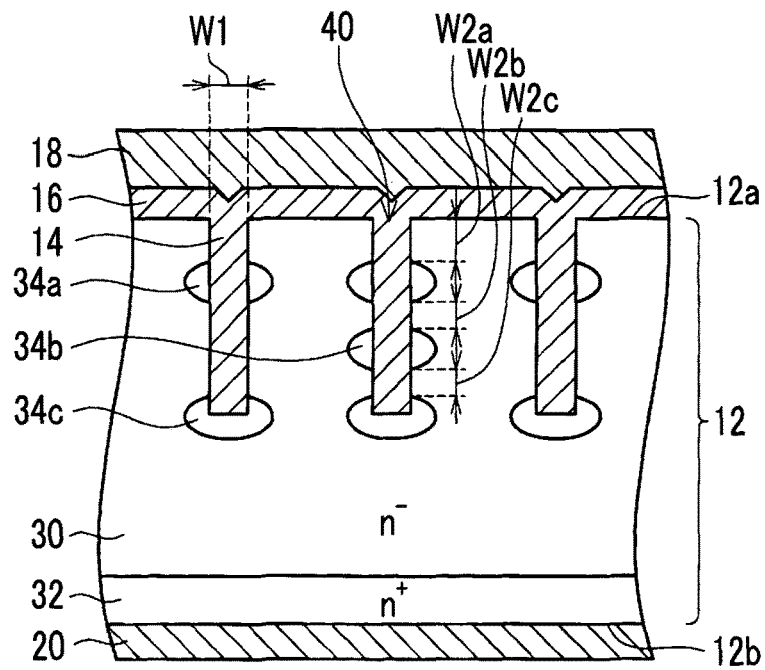
FIG. 16 is a sectional view of a semiconductor apparatus of a modification example.

In the semiconductor apparatuses of Examples 1 to 6 described above, although the three p-type regions 34a, 34b, 34c are provided for each anode trench 40, the number of p-type regions may be different among the anode trenches 40. For example, in Example 1, as shown in FIG. 16, there may be an anode trench 40 in which three p-type regions 34a, 34b, 34c are provided and an anode trench 40 in which two p-type regions 34a, 34c are provided. The same modification can be made to other Examples 2 to 6.

In Examples 1 to 6 described above, the anode trenches 40 extend in a stripe shape in parallel with each other. However, the shape of the anode trench 40 can be appropriately changed. For example, the anode trenches 40 may extend in a lattice shape in the upper surface 12a, or the anode trenches 40 may extend to draw a hexagon in the upper surface 12a.

In Examples 1 to 6 described above, the p-type regions 34a, 34b, 34c may have substantially the same p-type impurity concentration, or the p-type impurity concentrations of the p-type regions 34a, 34b, 34c may be different from one another.

In Examples 1 to 6 described above, the p-type impurity concentration may be uniform inside the p-type regions 34a, 34b, 34c, or the p-type impurity concentration may be changed according to positions inside the p-type regions 34a, 34b, 34c.

In Examples 2 and 3 described above, the p-type region 36 may be provided solely in a part of a range in which the front electrode 16 and the semiconductor substrate 12 are in contact with each other.

Figure 17:
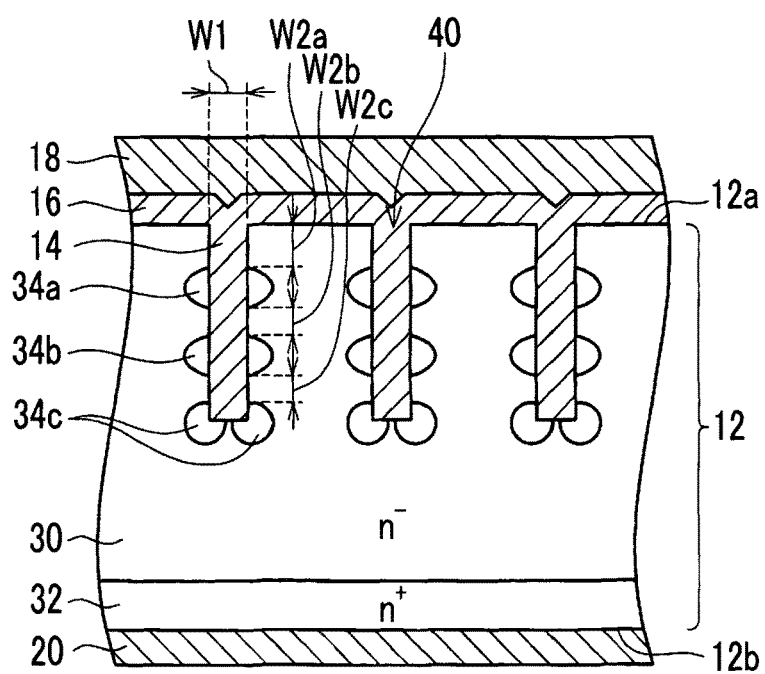
FIG. 17 is a sectional view of a semiconductor apparatus of a modification example.

In Examples 1 to 6 described above, the p-type region 34c may be in contact with the anode electrode 14 solely in a part of the bottom surface of the anode trench 40. For example, in Example 1, as shown in FIG. 17, the p-type region 34c may be divided in a horizontal direction within a range of being in contact with the bottom surface of the anode trench 40, or the drift region 30 may be in contact with the anode electrode 14 between the divided portions of the p-type regions 34c. According to the above-described configuration, it is possible to bring the drift region 30 into Schottky contact with the anode electrode 14 in the bottom surface of the anode trench 40. The same modification can be made to Examples 2 to 6.

In Examples 1 to 6 described above, the p-type region 34a may be exposed to the upper surface 12a of the semiconductor substrate 12 (that is, may be in contact with the front electrode 16).

The anode trench 40 is an example of a first trench. The p-type region 34c is an example of a first p-type region. The p-type regions 34a, 34b are an example of a second p-type region. The drift region 30 and the cathode region 32 are an example of a main n-type region. The p-type region 36 is an example of a third p-type region. The gate trench 42 is an example of a second trench.

The technical elements disclosed in the specification will be listed below. Note that the following technical elements are each independently useful.

In an example of the configuration disclosed in the specification, the first trench may extend in a stripe shape on the front surface of the semiconductor substrate. A relationship that the width W1 of the first trench on the front surface is smaller than the total value W2 of the widths of the Schottky interfaces measured along the depth direction of the first trench may be satisfied.

In a case where the anode electrode and the main n-type region are in contact with each other within a plurality of ranges with different depths, a value obtained by totaling the widths in the depth direction of the ranges in which the anode electrode and the main n-type region are in contact with each other becomes the total value W2. In a case where the anode electrode and the main n-type region are in contact with each other solely within a single range, the width in the depth direction of the range becomes the total value W2.

According to the above-described configuration, it is possible to further enlarge the area of the Schottky interface of the anode electrode and the main n-type region compared to a case where the anode electrode is provided on the front surface of the semiconductor substrate without providing the first trench.

In an example of the configuration disclosed in the specification, a front electrode that covers the front surface of the semiconductor substrate and is in contact with the anode electrode may be further provided. In the above-described case, the semiconductor substrate may further have a third p-type region that is in contact with the front electrode.

In the above-described configuration, since the third p-type region is provided within a range of being in contact with the front electrode of the semiconductor substrate, it is possible to more efficiently prevent the Schottky contact of the front electrode and the main n-type region in the front surface of the semiconductor substrate (the front surface within a range in which the third p-type region is present). Since it is difficult to stabilize the front surface state of the semiconductor substrate, in a case where the front electrode and the main n-type region are in Schottky contact with each other in the front surface of the semiconductor substrate, the characteristics of the SBD are not stable at the time of mass production. As described above, the Schottky contact of the front electrode and the main n-type region within a range in which the third p-type region is provided is more efficiently prevented, whereby it is possible to further stabilize the characteristics of the SBD.

In an example of the semiconductor apparatus disclosed in the specification, each of the first p-type region and the second p-type region may be formed in a stripe shape in a direction crossing the first trench.

In an example of the semiconductor apparatus disclosed in the specification, a front electrode that covers the front surface of the semiconductor substrate and is in contact with the anode electrode, a second trench provided in the front surface, a gate insulating layer that covers an inner surface of the second trench, and a gate electrode that is disposed inside the second trench and is insulated from the semiconductor substrate by the gate insulating layer may be further provided. The semiconductor substrate may further have an n-type source region that is in contact with the gate insulating layer and the front electrode, and a p-type body region that is in contact with the gate insulating layer and the front electrode, and separates the main n-type region from the source region. The main n-type region may not be in contact with the front electrode within a range between the first trench and the second trench.

According to the above-described configuration, a semiconductor apparatus in which an SBD and a MOSFET are provided on a single semiconductor substrate is obtained. Since the main n-type region is not in contact with the front electrode between the first trench and the second trench, it is possible to further stabilize the characteristics of the SBD.

In an example of the semiconductor apparatus disclosed in the specification, the main n-type region may be in contact with the gate insulating layer in a bottom surface of the second trench.

In the above-described configuration, it is possible to more effectively suppress electric field concentration in the bottom surface of the second trench with the depletion layer extending from the first p-type region. Furthermore, since the main n-type region is present within a range of being in contact with the bottom surface of the second trench, a path of a current below the channel is relatively wide. Therefore, it is possible to sufficiently reduce the on-resistance of the MOSFET.

Although the embodiment has been described above in detail, the embodiment is merely for illustration and is not intended to limit the claims. The technique described in the claims includes various modifications and alterations of the specific examples illustrated above. The technical elements described in the specification or the drawings may technically be useful alone or in various combinations, and are not limited to the combinations as originally claimed. The technique illustrated in the specification or the drawings may concurrently achieve a plurality of objects, and technical significance thereof resides in achieving one of the objects.

The invention claimed is:

1. A semiconductor apparatus comprising:
a semiconductor substrate;
a first trench provided in a front surface of the semiconductor substrate;
an anode electrode provided inside the first trench; and
a cathode electrode provided on a back surface of the semiconductor substrate, wherein:
the semiconductor substrate has
a first p-type region that is in contact with the anode electrode in a bottom surface of the first trench,
a second p-type region that is in contact with the anode electrode in a side surface of the first trench, and
a main n-type region which is in contact with the first p-type region and the second p-type region, is in Schottky contact with the anode electrode in the side surface of the first trench, separates the first p-type region from the second p-type region, and is in contact with the cathode electrode; and
the semiconductor substrate is configured to satisfy a relationship that an area of the first trench, when the front surface is viewed in a plan view, is smaller than an area of a Schottky interface where the main n-type region is in contact with the anode electrode in the side surface of the first trench.

2. The semiconductor apparatus according to claim 1, wherein the first trench extends in a stripe shape on the front surface, and the semiconductor apparatus is configured to satisfy a relationship that a width of the first trench on the front surface is smaller than a total value of widths of the Schottky interfaces measured along a depth direction of the first trench.

3. The semiconductor apparatus according to claim 1, further comprising:
a front electrode provided to cover the front surface of the semiconductor substrate and be in contact with the anode electrode.

4. The semiconductor apparatus according to claim 1, further comprising:
a front electrode provided to cover the front surface of the semiconductor substrate and be in contact with the anode electrode,
wherein the semiconductor substrate further has a third p-type region that is in contact with the front electrode.

5. The semiconductor apparatus according to claim 1, wherein each of the first p-type region and the second p-type region is formed in a stripe shape in a direction crossing the first trench.

6. The semiconductor apparatus according to claim 1, further comprising:
a front electrode provided to cover the front surface of the semiconductor substrate and be in contact with the anode electrode;
a second trench provided in the front surface;
a gate insulating layer provided to cover an inner surface of the second trench; and a gate electrode disposed inside the second trench and insulated from the semiconductor substrate by the gate insulating layer, wherein the semiconductor substrate further has an n-type source region that is in contact with the gate insulating layer and the front electrode, and a p-type body region that is in contact with the gate insulating layer and the front electrode, and separates the main n-type region from the source region; and the main n-type region is not in contact with the front electrode within a range between the first trench and the second trench.

7. The semiconductor apparatus according to claim 6, wherein the main n-type region is in contact with the gate insulating layer in a bottom surface of the second trench.

* * * * *